(12) United States Patent
Chen

(10) Patent No.: US 8,882,870 B2
(45) Date of Patent: Nov. 11, 2014

(54) COATED TOOL

(75) Inventor: Lu Chen, Iwaki (JP)

(73) Assignee: Tungaloy Corporation, Iwaki-shi, Fukushima (JP)

( * ) Notice: Subject to any disclaimer, the term of this patent is extended or adjusted under 35 U.S.C. 154(b) by 163 days.

(21) Appl. No.: 13/813,859

(22) PCT Filed: Aug. 4, 2011

(86) PCT No.: PCT/JP2011/067826
§ 371 (c)(1),
(2), (4) Date: Feb. 1, 2013

(87) PCT Pub. No.: WO2012/018063
PCT Pub. Date: Feb. 9, 2012

(65) Prior Publication Data
US 2013/0136907 A1    May 30, 2013

(30) Foreign Application Priority Data

Aug. 4, 2010   (JP) .................................. 2010-175216

(51) Int. Cl.
*B23B 27/14*   (2006.01)
*C23C 14/02*   (2006.01)
(Continued)

(52) U.S. Cl.
CPC ............. *B23B 27/148* (2013.01); *C23C 14/024* (2013.01); *C23C 14/0641* (2013.01); *C23C 14/0664* (2013.01); *C23C 14/081* (2013.01); *C23C 14/32* (2013.01); *C23C 30/005* (2013.01); *B23B 51/00* (2013.01); *B23C 5/16* (2013.01); *C23C 28/042* (2013.01); *C23C 28/044* (2013.01); *B23B 2228/08* (2013.01); *B23B 2228/105* (2013.01)

USPC ................ 51/307; 51/309; 428/216; 428/325; 428/336; 428/469; 428/472; 428/697; 428/698; 428/699; 428/701; 428/702

(58) Field of Classification Search
CPC .. B23B 27/148; B23B 51/00; B23B 2228/08; B23B 2228/105
USPC ............ 51/307, 309; 428/216, 325, 366, 469, 428/472, 697, 698, 699, 701, 702
See application file for complete search history.

(56) References Cited

U.S. PATENT DOCUMENTS 5,123,934 A * 6/1992 Katayama et al. .............. 51/309
5,447,804 A    9/1995 Schulz et al.
(Continued)

FOREIGN PATENT DOCUMENTS

| CA | 2665044 | 3/1999 |
|----|---------|--------|
| JP | 11-58105 A | 3/1999 |

(Continued)

OTHER PUBLICATIONS

International Preliminary Report on Patentability dated Mar. 12, 2013 issued in PCT counterpart application (No. PCT/JP2011/067826).

(Continued)

*Primary Examiner* — Archene Turner
(74) *Attorney, Agent, or Firm* — Womble Carlyle

(57) ABSTRACT

A coated tool has a substrate and a coating film coated on the surface thereof. The coating film includes an intermediate film coated on the surface of the substrate, and an oxide film coated on the surface of the intermediate film. A crack coefficient R obtained by measuring a crack length dc (μm) which is generated on the surface of the coated tool by pushing a Vickers indenter into the surface of the coating film with an applied load P=196(N), and a fracture toughness $K_{IC}$ (MPa·m$^{0.5}$) of the substrate, and by calculating from the following numerical formula:

$R = P/(dc \cdot K_{IC})$, is 0.07 to 0.12 m$^{0.5}$.

20 Claims, 3 Drawing Sheets

(51) Int. Cl.

| | |
|---|---|
| *C23C 14/06* | (2006.01) |
| *C23C 14/08* | (2006.01) |
| *C23C 14/32* | (2006.01) |
| *C23C 30/00* | (2006.01) |
| *B23B 51/00* | (2006.01) |
| *B23C 5/16* | (2006.01) |
| *C23C 28/04* | (2006.01) |

(56) References Cited

U.S. PATENT DOCUMENTS

| | | | |
|---|---|---|---|
| 6,767,627 B2 * | 7/2004 | Morikawa et al. | 428/699 |
| 7,939,181 B2 * | 5/2011 | Ramm et al. | 428/701 |
| 8,025,989 B2 * | 9/2011 | Larsson | 428/336 |
| 8,129,040 B2 * | 3/2012 | Quinto et al. | 428/697 |
| 8,603,617 B2 * | 12/2013 | Schier et al. | 428/216 |
| 2010/0260560 A1 | 10/2010 | Schier | |
| 2010/0295251 A1 | 11/2010 | Sekiya et al. | |

FOREIGN PATENT DOCUMENTS

| | | | |
|---|---|---|---|
| JP | 2003-306738 A | | 10/2003 |
| JP | 2008-069420 A | | 3/2008 |
| JP | 2008-149390 A | | 7/2008 |
| JP | 2009-056540 A | | 3/2009 |
| JP | 2009-203489 A | * | 9/2009 |
| WO | 2010/002344 | * | 1/2010 |

OTHER PUBLICATIONS

International Search Report dated Oct. 18, 2011 issued in PCT counterpart application (No. PCT/JP2011/067826).

Written Opinion dated Oct. 18, 2011 issued in PCT counterpart application (No. PCT/JP2011/067826).

\* cited by examiner

COATED TOOL

RELATED APPLICATIONS

This is a 371 US National Phase of International Patent Application No. PCT/JP2011/067826, filed Aug. 4, 2011, and published as WO 2012/018063A1 on Feb. 9, 2012, which claims priority to JP 2010-175216, filed Aug. 4, 2010. The contents of the aforementioned applications are incorporated by reference in their entirety.

TECHNICAL FIELD

The present invention relates to a coated tool to be used for high speed cutting of a steel, cutting of a stainless steel and a difficult-to-cut material, etc., or a mold.

BACKGROUND ART

As a prior art of a coated tool in which an oxide film is coated by the physical vapour deposition, there is a cutting tool in which a hard layer substantially consisting of $(Al,Cr)_2O_3$ crystal material a chromium content of which is greater than 5 atomic % is coated (for example, see Patent Literature 1.). However, this cutting tool involves the problems that adhesiveness of the hard layer and the substrate is not sufficient, and it is inferior in crack resistance and wear resistance.

PRIOR ART REFERENCES

Patent Literatures

[Patent Literature 1] JP Patent No. 3323534B

SUMMARY OF THE INVENTION

Problems to be Solved by the Invention

When high speed cutting of a steel, or cutting of a stainless steel and a difficult-to-cut material, etc., is carried out by using a coated tool, abrasive wear, chemical wear, adhesion wear or fracture, etc., occurs to the coated tool. To elongate the tool life of a cutting tool with a wide machining region, it is necessary to improve not only one property but also all the properties with good balance. In the prior art of the coated tools in which an oxide film is coated by the physical vapour deposition, there was a problem that crack resistance and wear resistance of the oxide film cannot be improved simultaneously. Also, in the prior art of the coated tools in which an oxide film is coated by the physical vapour deposition, adhesiveness between the oxide film and the substrate was not sufficient so that excellent heat resistance or chemical reaction resistance of the oxide film could not be sufficiently shown. The present invention has been done to overcome such a circumstance, and an object thereof is to provide a coated tool which realizes a long tool life in a high speed cutting of a steel, and a cutting of a stainless steel and a difficult-to-cut material, etc., and which realizes a long life in a mold.

Means to Solve the Problems

The present inventor has studied elongation of tool life of a coated tool in which a coating film including an oxide film is coated by the physical vapour deposition, and as a result, he has found that adhesiveness of the substrate and the coating film, and crack propagation characteristics of the coating film are affected by the materials of the substrate and characteristics of the respective interfaces, and if a crack coefficient R obtained by measuring a crack length dc (μm) which is generated on the surface of the coated tool by pushing a Vickers indenter into a surface of a coated tool in which a coating film including an oxide film is coated by the physical vapour deposition with an applied load P of 196N, and a fracture toughness $K_{IC}$ (MPa·m$^{0.5}$) of the substrate is within a specific range, the tool life of the coated tool in which a film including an oxide film is coated by the physical vapour deposition can be elongated.

That is, the coated tool of the present invention comprises a substrate and a coating film coated on the surface thereof, wherein the coating film contains an intermediate film coated on the surface of the substrate, and an oxide film coated on the surface of the intermediate film by a physical vapour deposition, and wherein a crack coefficient R obtained by measuring a crack length dc (μm) which is generated on the surface of the coated tool by pushing a Vickers indenter into the surface of the coated tool with an applied load P of 196N, and a fracture toughness $K_{IC}$ (MPa·m$^{0.5}$) of the substrate, and by calculating from the following Numerical formula 1 of 0.07 to 0.12 m$^{0.5}$.

$$R = P/(dc \cdot K_{IC})$$ [Numerical formula 1]

Also, preferably, in the coated tool of the present invention, the coating film comprises an intermediate film comprising a metal compound represented by ML wherein M represents at least one element selected from Ti, Zr, Hf, V, Nb, Ta, Cr, Mo, W, Al and Si, L represents one or two elements selected from C and N, having an average film thickness of 1 to 6 μm, which film comprises a single layer film or a multi-layered film of two or more layers, an oxide film comprising $(Al_{(1-y)}Cr_y)_2O_3$ wherein y represents an atomic ratio of Cr based on the sum of Al and Cr, and y satisfies 0.1≤y≤0.5, having an average film thickness of 0.01 to 0.9 μm, coated on the surface of the intermediate film, and an upper film comprising a metal compound represented by QJ, wherein Q represents at least one element selected from Ti, Zr, Hf, V, Nb, Ta, Cr, Mo, W, Al and Si, and J represents at least one element selected from C, N and O, having an average film thickness of 0.2 to 2 μm, which film comprises a single layer film or a multi-layered film of two or more layers, and which is coated on the surface of the oxide film.

Further, preferably, in the coated tool of the present invention, the coating film comprises an intermediate film comprising $Ti_{(1-x)}Al_xN$ wherein x represents an atomic ratio of Al based on the sum of Ti and Al, and x satisfies 0.35≤x≤0.7, having an average film thickness of 1 to 6 μm, an oxide film comprising $(Al_{(1-y)}Cr_y)_2O_3$ wherein y represents an atomic ratio of Cr based on the sum of Al and Cr, and y satisfies 0.1≤y≤0.5, having an average film thickness of 0.01 to 0.9 μm, coated on the surface of the intermediate film, and an upper film comprising $Ti_{(1-z)}Al_zN$ wherein z represents an atomic ratio of Al based on the sum of Ti and Al, and z satisfies 0≤z≤0.7, having an average film thickness of 0.2 to 2 μm, coated on the surface of the oxide film.

Effects of the Invention

The coated tool of the present invention is excellent in wear resistance, fracture resistance and oxidation resistance. When the coated tool of the present invention is used as a cutting tool, then, it can be obtained the effect that the tool life is elongated. In particular, it shows high effects in the cutting in which cutting conditions are severe such as a high-speed cutting, a high-feed cutting, a machining of a work piece material with high hardness, and a machining of a difficult-to-cut material, etc. When the coated tool of the present invention is used as a wear resistant tool, then, it can give the effect that the tool life is elongated.

BEST MODE TO CARRY OUT THE INVENTION

Whereas the reason why the tool life can be elongated when the crack coefficient R is within the specific range is not clear, it can be considered that, it is considered to originate from a highly toughnessed mechanism of the coating film due to a stress-shielding effect in which a front damaged portion of cracks of the coating film develops, and it is considered that, when the crack coefficient R is larger, then, the highly toughnessed film dissipates fracture energy so that cracks are difficult to propagate at the tool surface. That is, the crack coefficient R of the present invention shows the difficulty of propagation of the cracks. If the crack coefficient R is 0.07 $m^{0.5}$ or more, propagation of the cracks becomes slow, and occurrence of large chippings can be suppresseed so that an effect of improving the tool life can be obtained. However, if the crack coefficient R becomes large exceeding 0.12 $m^{0.5}$, peeling is likely caused between the coating film and the substrate, whereby the tool life becomes short. Therefore, by adjusting the crack length dc to 90 to 310 μm or so, and the fracture toughness $K_{IC}$ of the substrate to 8 to 18 MPa·$m^{0.5}$ or so, respectively, the crack coefficient R is made within the range of 0.07 to 0.12 $m^{0.5}$. Among these, the crack coefficient R is further preferably 0.08 to 0.11 $m^{0.5}$.

dc is a sum of crack lengths dn (n=1, 2, 3, 4) of four cracks extended from the vicinity of corners of a Vickers indentation generated on the surface of the coating film by pushing a Vickers indenter into the surface of the coated tool with an applied load of 196N as shown in the following Numerical formula 2.

$$dc=d1+d2+d3+d4 \quad \text{[Numerical formula 2]}$$

Figure 1:
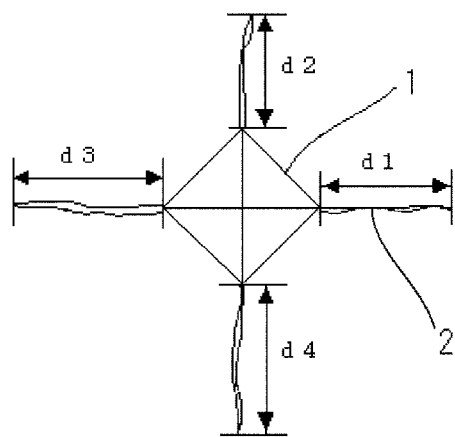
FIG. 1 This is a schematic drawing of a Vickers indentation and cracks generated on the surface of the coated tool.

As shown in FIG. 1, crack lengths dn (n=1, 2, 3, 4) extended from the vicinity of corners of a Vickers indentation are measured as a straight line distance from the origin of crack generation at the vicinity of the corner of the Vickers indentation to the top of the cracks. Also, when two or more cracks are generated at the vicinity of the corner of the Vickers indentation, the longest crack length is used for calculating dc as the crack length dn (n=1, 2, 3, 4) of the corner, but other crack lengths which are not the longest are not used for calculating the dc. The crack length dc can be mainly adjusted by the composition of the substrate, constitution and composition of the coating film and coating conditions. The effects of the coating conditions of the coating film to the crack length dc are large, and when the absolute value of the substrate bias voltage to be used for coating the oxide film, the intermediate film or the upper film is made small, then, the crack length dc can be made long. For example, when the substrate bias voltage to which a pulse has been applied to be used for coating the oxide film is changed from −70V to −40V, then, the crack length dc becomes longer by about 40 μm.

The substrate of the coating member of the present invention may be specifically mentioned a sintered alloy, ceramics, a cBN sintered body, a diamond sintered body, etc. Among these, the sintered alloy is preferred since it is excellent in fracture resistance and wear resistance, and among these, cermets and cemented carbide are more preferred, of these, cemented carbide is further preferred, and above all, a cemented carbide comprising 75 to 93% by volume of WC, 0 to 5% by volume of a cubic crystal phase which comprises at least one of a carbide and a nitride of Ti, Zr, Hf, V, Nb, Ta, Cr, Mo or W and mutual solid solutions thereof, and 7 to 20% by volume of a binder phase which comprises Co as a main component, and in which an average grain size of WC obtained by the Fullman's equation is 0.5 to 2 μm is still more preferred. Here, the average grain size of WC obtained by the Fullman's equation means an average grain size of WC measured by using the following formula of Numerical formula 3:

$$dm=(4/\pi)\times(NL/NS) \quad \text{[Numerical formula 3]}$$

(wherein dm represents an average grain size of WC, π is a circular constant, NL represents a number of WC per a unit length hit by an arbitrary straight line on the cross-sectional structure of a photograph taken with regard to the cross-sectional structure of the sintered body, and NS represents a number of WC contained in an arbitrary unit area.). The cubic crystal phase can be specifically mentioned (Nb,W)C, (Nb,W)CN, (Ti,W)C, (Ti,W)CN, (Ti,Ta,W)C, (Ti,Ta,W)CN, (Ti,Nb,W)C, (Ti,Nb,W)CN, (Ti,Ta,Nb,W)C, (Ti,Ta,Nb,W)CN, (Ti,Ta,Zr,W)C, (Ti,Ta,Zr,W)CN, (Ti,Nb,Zr,W)C, (Ti,Nb,Zr,W)CN, (Ti,Ta,Nb,Zr,W)C, (Ti,Ta,Nb,Zr,W)CN, etc. In the present invention, the binder phase consisting of Co as the main component means a binder phase comprising Co or a binder phase comprising a Co alloy in which at least one of Ti, Zr, Hf, V, Nb, Ta, Cr, Mo and W is dissolved in Co in an amount of 30% by mass or less based on the whole Co alloy.

It is possible to control the fracture toughness $K_{IC}$ of the substrate by the composition or structure. For example, in the case of a cemented carbide substrate, $K_{IC}$ of the cemented carbide substrate can be heightened by increasing an amount of the binder phase of the cemented carbide or making the average grain size of WC of the cemented carbide large. For example, when the amount of the binder phase of the cemented carbide is increased from 8% by volume to 16% by volume, $K_{IC}$ of the cemented carbide substrate becomes higher by about 3 MPa·$m^{0.5}$. Also, when the average grain size of WC of the cemented carbide is made large from 0.8 μm to 1.5 μm, $K_{IC}$ of the cemented carbide substrate becomes higher by about 7 to 9 MPa·$m^{0.5}$. $K_{IC}$ of the substrate is measured at the portion at which there is no residual stress after removing the coating film. More specifically, after removing the coating film by diamond grindstones with 150 mesh, the surface of the substrate is further polished by diamond grindstones with 1-500 mesh with a depth of 20 μm or more, and then, the surface is mirror polished by using a diamond paste an average particle size of diamond particles of which is 1 µm or less. A Vickers indenter is pushed into the minor polished surface of the substrate with an applied load of 196N, and according to the Vickers indentation method using the following formula of Numerical formula 4 described in a literature "Niihara Koichi, "Indentation microfracture of ceramics, Its application and problems", Ceramics Japan, 1985, Vol. 20, No. 1, p. 12-18", $K_{IC}$ of the substrate can be measured.

$$K_{IC}=0.203 \cdot H \cdot a^{0.5} \cdot (c/a)^{-1.5}$$ [Numerical formula 4]

Figure 2:
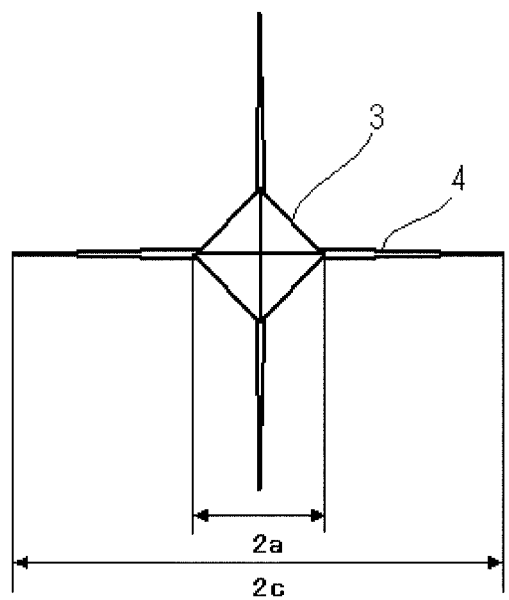
FIG. 2 This is a schematic drawing of a Vickers indentation and cracks generated on the mirror polished surface of the substrate.

Wherein, in the above-mentioned formula of Numerical formula 4, $K_{IC}$ (MPa·m$^{0.5}$) represents fracture toughness, H (MPa) represents Vickers hardness, a (µm) represents a half length of an indentation width across corners, and c (µm) represents a half length of the distance between the both ends of the crack. a and c can be obtained by measuring an indentation width across corners 2a and the distance between the both ends of the crack 2c as shown in FIG. 2.

The coating film of the present invention contains the intermediate film coated on the surface of the substrate, and the oxide film coated on the surface of the intermediate film. The intermediate film improves wear resistance by improving adhesiveness between the substrate and the oxide film. Further, when an upper film is coated on the surface of the oxide film, wear of early stage can be suppressed, so that it is preferred.

When the intermediate film of the present invention comprises a metal compound represented by ML (wherein M represents at least one element selected from Ti, Zr, Hf, V, Nb, Ta, Cr, Mo, W, Al and Si, and L represents one or two elements selected from C and N.), wear resistance is improved, so that it is preferred. The intermediate film of the present invention may be specifically mentioned TiN, TiCN, TiAlN, TiAlZrN, TiAlCrN, AlCrN, etc., further specifically mentioned TiN, TiCN, $Ti_{0.33}Al_{0.67}N$, $Ti_{0.35}Al_{0.65}N$, $Ti_{0.5}Al_{0.4}Zr_{0.1}N$, $Ti_{0.5}Al_{0.4}Cr_{0.1}N$, $Ti_{0.55}Al_{0.45}N$, $Al_{0.7}Cr_{0.3}N$, etc. Among these, the intermediate film of the present invention is further preferably TiAlN, among these, the intermediate film of the present invention is more preferably a metal compound comprising $Ti_{(1-x)}Al_xN$ (wherein x represents an atomic ratio of Al based on the sum of Ti and Al, and x satisfies 0.35≤x≤0.7.). This is because, if x is less than 0.35, there is a case where the hardness of the intermediate film is lowered whereby wear resistance is lowered, while if x becomes large exceeding 0.7, AlN is contained, so that wear resistance is lowered in some cases. Among these, 0.4≤x≤0.6 is further preferred. Film constitution of the intermediate film of the present invention may be either a single layer film of one layer, or a multi-layered film of two or more layers, or may be an alternately laminated film which is a kind of the multi-layered film where thin films having different compositions and a thickness of 5 to 100 nm are alternately laminated. If the average film thickness of the intermediate film of the present invention becomes less than 1 µm, there is a case where wear resistance is lowered, while if the average film thickness of the intermediate film of the present invention becomes thick exceeding 6 µm, there is a case where the coating film is likely peeled off. Therefore, the average film thickness of the intermediate film of the present invention is preferably 1 to 6 µm, more preferably 3 to 6 µm.

The average film thickness of the coating film in the present invention can be measured by observing the cross-section of the coating film by an optical microscope, a scanning electron microscope (SEM) or a transmission electron microscope (TEM). More specifically, three portions or more of the cross-section of the coating film were photographed by an optical microscope, a scanning electron microscope or a transmission electron microscope, and an average value of the film thicknesses measured on the photograph was deemed an average film thickness. Also, the composition of the coating film can be measured by using an elemental analyzer such as a secondary ion mass spectrometer (SIMS), an energy dispersive X-ray spectrometer (EDS), a glow discharge spectrometer (GDS), etc.

If the intermediate film of the present invention is a cubic crystal, it is preferred since wear resistance is improved. Among these, when the peak intensity of the (200) plane diffraction line is the highest among the diffraction lines of the intermediate film obtained by conducting X-ray diffraction measurement by the 2θ/θ method using a CuKα ray in the range of 2θ=10 to 140°, it is preferred since wear resistance is improved. To make the peak intensity of the (200) plane diffraction line of the intermediate film high, Al element is preferably contained in the intermediate film. Also, when an X-ray intensity distribution of an a axis of the pole figure with regard to the (200) plane of the intermediate film shows the maximum intensity at an a angle in the range of 80 to 90°, it is preferred since adhesiveness with the oxide film on the intermediate film is excellent and wear resistance is further improved. When the intermediate film of the present invention is subjected to the pole figure measurement of an X-ray diffraction, the fact that the X-ray intensity distribution of an α axis of the pole figure with regard to the (200) plane shows the maximum intensity in the range of an α angle of 80 to 90° means that among the cubic crystals constituting the intermediate film, the number of crystals in which the (200) planes are in a direction parallel to the surface of the coated tool together is large. To make the X-ray intensity distribution of an α axis of the pole figure with regard to the (200) plane of the intermediate film show the maximum intensity in the range of an α angle of 80 to 90°, it is preferred to make an Al element contained in the intermediate film and further make the absolute value of the substrate bias voltage at the time of coating the intermediate film large. A coated tool where the X-ray intensity distribution of an α axis of the pole figure with regard to the (200) plane shows the maximum intensity in the range of an α angle of 80 to 90° can further improve wear resistance as compared with a coated tool where the X-ray intensity distribution of an α axis of the pole figure with regard to the (200) plane shows the maximum intensity in the range of an α angle of less than 80°. The reason is not yet clear, but it can be considered that the (200) planes which are in a direction parallel to the surface of the coated tool largely occupy the surface of the intermediate film so that wear resistance is further improved. Also, adhesiveness with the oxide film is excellent so that excellent oxidation resistance of the oxide film is sufficiently shown whereby wear resistance of the whole coating film is considered to be further improved.

Figure 3:
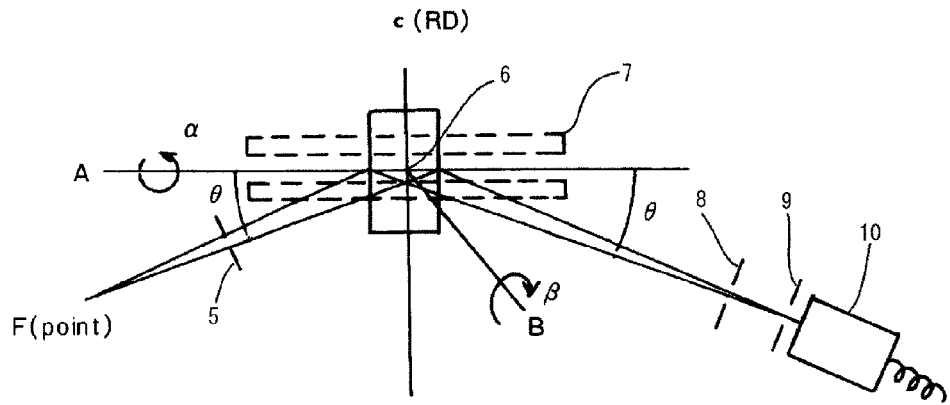
FIG. 3 This is a schematic drawing showing an optical system of the Schulz reflection method.
Figure 4:
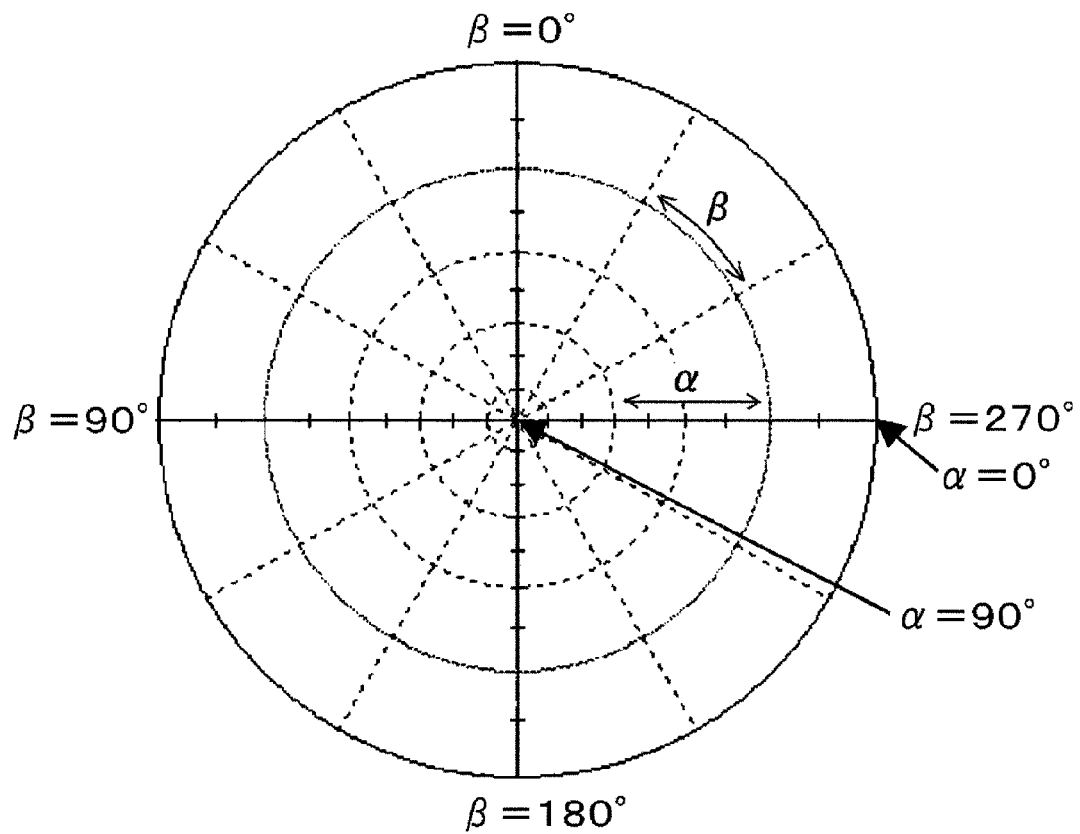
FIG. 4 This is a pole figure showing the positions of an α angle and a β angle.
Figure 5:
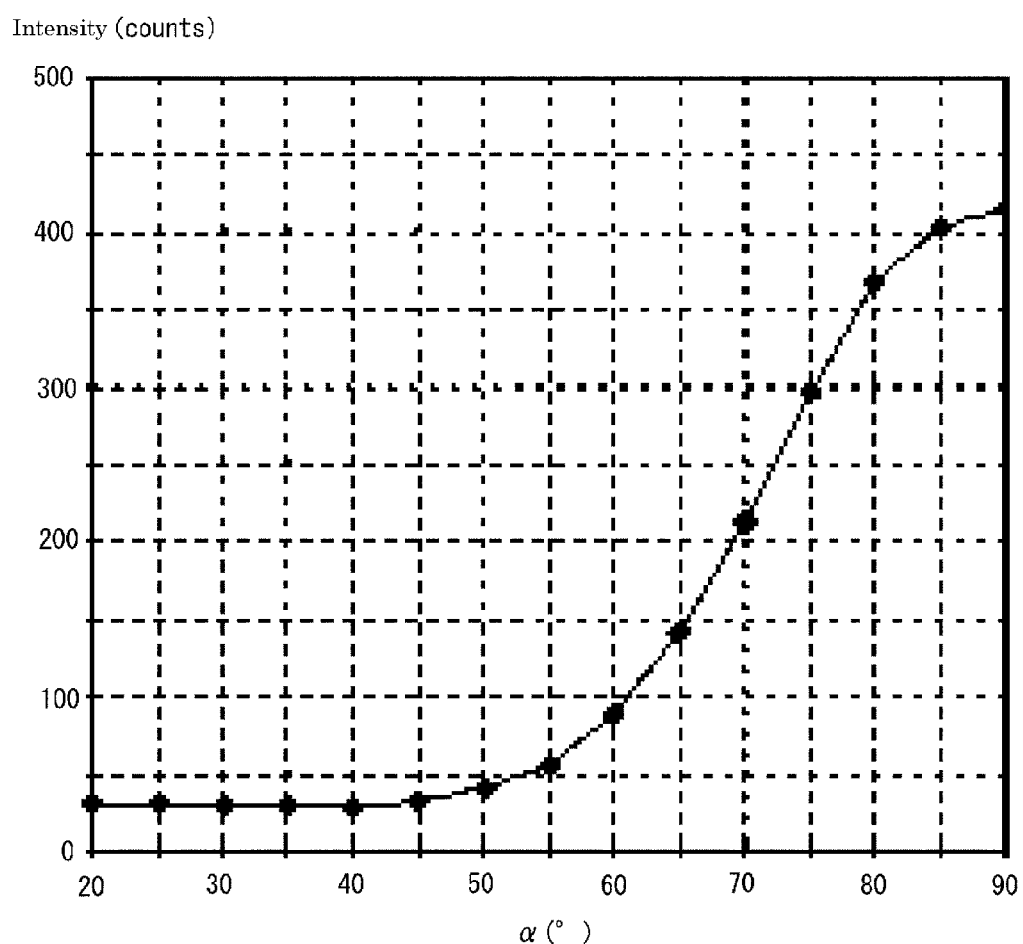
FIG. 5 This is a drawing showing one example of an X-ray intensity distribution of an α axis of a pole figure with regard to a (200) plane of the intermediate film of the present invention.

An X-ray intensity distribution of an α axis of the pole figure with regard to the (200) plane of the intermediate film of the present invention can be measured by the Schulz reflection method. The Schulz reflection method is, as shown in FIG. 3, a method for measuring an intensity distribution of a diffraction line by changing a direction of a sample to the incident X ray according to an α rotation whose center is an A axis in the sample surface, and a f rotation whose center is a normal (B axis) of the sample surface, i.e., a rotation in the sample surface, using an optical system of reflection with equal angles in which 2θ is a diffraction angle, and an angle of incident and an angle of reflection are each θ. When B axis is on a plane determined by an incident line and a diffraction line, then, the α angle is defined to be 90°. When the α angle is 90°, it becomes a center point on the pole figure as shown in FIG. 4. As a specific measurement method, for example, by using a pole measurement program of an X ray diffraction system RINT-TTR III available from RIGAKU CORPORATION, an X-ray intensity distribution of an α axis in the pole figure with regard to the (200) plane of the intermediate film can be measured by the following measurement conditions and measurement method.
[Measurement Conditions]
(1) TTR III level goniometer
(2) Multipurpose measurement attachment for pole
(3) Scanning method: concentric circle
(4) β scanning range: 0 to 360°/5° pitch
(5) β scanning speed: 180°/min
(6) γ amplitude: 0 mm
[Measurement Method (Schulz Reflection Method)]
(1) Fixed angle: a diffraction angle for the (200) plane of the intermediate film is made 43.0° to 44.0°.
(2) α scanning range: 20 to 90° (5° step)
(3) Target: Cu, Voltage: 50 kV, Current: 250 mA
(4) Divergence slit: ¼°
(5) Scatter slit: 6 mm
(6) Divergence vertical limit slit: 5 mm Whereas an α angle showing the maximum intensity can be read from a contour line of a pole figure with regard to the (200) plane, an α angle showing the maximum intensity can be easily obtained from an X-ray intensity distribution of an α axis of the pole figure with regard to the (200) plane as shown in FIG. 5.

The oxide film coated by the physical vapour deposition on the surface of the intermediate film of the present invention preferably comprises $(Al_{(1-y)}Cr_y)_2O_3$ (wherein y represents an atomic ratio of Cr based on the sum of Al and Cr, and y satisfies $0.1 \leq y \leq 0.5$.), since heat resistance and chemical reaction resistance are improved. This is because, if y is less than 0.1, there is a case where the film formation process is unstable and good film-quality cannot be obtained, while if y becomes large exceeding 0.5, there is a case where the crystal grains of the oxide film become coarse and crack resistance is lowered. Among these, it is further preferably $0.1 \leq y \leq 0.3$. The oxide film of the present invention can be specifically mentioned $(Al_{0.5}Cr_{0.5})_2O_3$, $(Al_{0.55}Cr_{0.45})_2O_3$, $(Al_{0.6}Cr_{0.4})_2O_3$, $(Al_{0.7}Cr_{0.3})_2O_3$, $(Al_{0.8}Cr_{0.2})_2O_3$, $(Al_{0.9}Cr_{0.1})_2O_3$, etc.

If the average film thickness of the oxide film of the present invention is less than 0.01 μm, heat resistance or chemical reaction resistance as the oxide film cannot sufficiently be shown in some cases, while if the average film thickness of the oxide film of the present invention becomes thick exceeding 0.9 μm, adhesiveness of the whole coating film is lowered and wear resistance is lowered in some cases, so that the average film thickness of the oxide film of the present invention is preferably 0.01 to 0.9 μm, and more preferably 0.1 to 0.5 μm.

When the upper film of the present invention comprises a metal compound represented by QJ (wherein Q represents at least one element selected from Ti, Zr, Hf, V, Nb, Ta, Cr, Mo, W, Al and Si, J represents at least one element selected from C, N and O.), then, wear resistance is improved so that it is preferred. The upper film of the present invention may be specifically mentioned TiN, TiCN, TiAlN, TiAlZrN, TiAlCrN, AlCrN, etc., and there may be more specifically mentioned TiN, TiCN, $Ti_{0.33}Al_{0.67}N$, $Ti_{0.35}Al_{0.65}N$, $Ti_{0.5}Al_{0.4}Zr_{0.1}N$, $Ti_{0.5}Al_{0.4}Cr_{0.1}N$, $Ti_{0.55}Al_{0.45}N$, $Al_{0.7}Cr_{0.3}N$, etc. Among these, Q is more preferably Ti, or Ti and Al. Among these, the upper film of the present invention further preferably comprises $Ti_{(1-z)}Al_zN$ (wherein z represents an atomic ratio of Al based on the sum of Ti and Al, and z satisfies $0 \leq z \leq 0.7$.). This is because if z becomes large exceeding 0.7, AlN is contained whereby wear resistance is lowered in some cases. Among these, $0.45 \leq z \leq 0.7$ is more preferred. The film constitution of the upper film of the present invention may be either a single layer film of one layer, or a multi-layered film of two or more layers, or may be an alternately laminated film which is a kind of the multi-layered film where thin films having different compositions and a thickness of 5 to 100 nm are alternately laminated. An average film thickness of the upper film of the present invention is preferably 0.2 to 2 μm, and more preferably 0.4 to 2 μm. This is because if the average film thickness of the upper film of the present invention is less than 0.2 μm, wear of the oxide film becomes rapid in some cases, while if the average film thickness of the upper film of the present invention becomes thick exceeding 2 μm, adhesiveness between the coating film and the substrate is lowered so that wear resistance is lowered in some cases.

By making the surface of the coated tool of the present invention smooth by means of a mechanical treatment, the effects of improving chip removal and suppressing chipping of cutting blades in cutting can be obtained, and further cutting life can be elongated.

The coated tool of the present invention is excellent in wear resistance, fracture resistance and oxidation resistance, so that it shows excellent properties as a cutting tool. As the cutting tool, there may be mentioned, for example, an insert, ball end mill, multi-blade end mill, drill, cutter, broach, reamer, hob, router, etc. Also, the coated tool of the present invention shows excellent properties when it is used as a wear resistant tool such as a mold and a punch.

The coated tool of the present invention coats the coating film on the substrate in such a way that a crack coefficient R becomes 0.07 to 0.12 $m^{0.5}$.

For example,
(1) by preparing a cemented carbide substrate comprising 75 to 93% by volume of WC, 0 to 5% by volume of a cubic crystal phase which comprises at least one of a carbide and a nitride of Ti, Zr, Hf, V, Nb, Ta, Cr, Mo and W, and mutual solid solutions thereof, and 7 to 20% by volume of a binder phase comprising Co as a main component, wherein an average grain size of WC is 0.5 to 2 μm, and through
(2) a heating step wherein the substrate is mounted in an arc discharge ion plating apparatus into which a target having a predetermined component ratio of metal element(s) of a coating film such as an intermediate film, an oxide film and an upper film is placed, and heating the same in vacuo of 0.5 Pa or less by a heater until the substrate temperature becomes 500 to 650° C.,
(3) an etching step wherein an Ar gas is introduced into the arc discharge ion plating apparatus to remove impurities which inhibit film-formation of the coating film from the surface of the substrate, and etching of the surface of the substrate is carried out at a pressure in the arc discharge ion plating apparatus of 0.2 to 1 Pa, under Ar atmosphere, and a direct current bias voltage of the substrate of −100 to −600V for 30 to 80 minutes,
(4) an intermediate film-forming step wherein starting gas such as $N_2$ is introduced into the arc discharge ion plating apparatus to adjust the pressure therein to 1 to 4 Pa, and arc discharge is carried out to a target having a predetermined component ratio of the metal element(s) of the intermediate film with a direct current bias voltage of the substrate of −50 to −80V, and an arc current of 150 to 200 A for 60 to 360 minutes to form the intermediate film,
(5) an oxide film-forming step wherein arc discharge is started to a target having a predetermined component ratio of the metal element(s) of the oxide film with an arc current of 120 to 170 A, mixed gas of $O_2$ and $N_2$ is supplied into the arc discharge ion plating apparatus to adjust the pressure therein to 0.2 to 2 Pa, a bias voltage of the substrate is made a bias voltage of −20 to −60V where a pulse is applied, arc discharge is carried out with an arc current of 120 to 170 A for 1 to 5 minutes, next, O₂ gas alone is supplied into the arc discharge ion plating apparatus to adjust the pressure therein to 0.2 to 2 Pa, a bias voltage of the substrate is made a bias voltage of −20 to −60V where a pulse is applied, and arc discharge is carried out to a target having a predetermined component ratio of the metal element(s) of the oxide film with an arc current of 120 to 170 A for 5 to 50 minutes to form the oxide film, and (6) an upper film-forming step wherein starting gas such as N₂ is introduced into the arc discharge ion plating apparatus to adjust the pressure therein to 1 to 4 Pa, a bias voltage of the substrate is made a bias voltage of −20 to −80V where a pulse is applied, and arc discharge is carried out to a target having a predetermined component ratio of the metal element(s) of the upper film with an arc current of 150 to 200 A for 5 to 60 minutes to form the upper film, the coated tool of the present invention having the crack coefficient R of 0.07 to 0.12 m$^{0.5}$ can be obtained.

EXAMPLES

Example 1

As the substrate, a cutting insert which is a cemented carbide consisting of 83.8% by volume of WC, and 16.2% by volume of a Co alloy (Co alloy consisting of 94% by mass Co-6% by mass Cr) wherein an average grain size of WC obtained by the Fullman's equation is 0.8 μm, and which has a shape of an ISO Standard CNMG120408 was prepared.

With regard to Present products 1 to 4, the substrate was mounted in an arc discharge ion plating apparatus in which targets having component ratios of the metal element(s) corresponding to an intermediate film, an oxide film and an upper film shown in Table 1 had been provided, and heated by a heater in vacuo of 0.5 Pa or less until the substrate temperature became 600° C. Then, Ar gas was introduced into the arc discharge ion plating apparatus, a pressure in the arc discharge ion plating apparatus was adjusted to 0.8 Pa to make an Ar atmosphere. Ar etching was carried out to the substrate with a direct current bias voltage of −250V for 70 minutes, then, an N₂ gas was introduced into the arc discharge ion plating apparatus to adjust the pressure therein to 2 to 3 Pa. Further, arc discharge was carried out to the target having a component ratio of the metal element(s) corresponding to the intermediate film under the conditions of a direct current bias voltage of the substrate of −70V and an arc current of 180 A for 260 to 300 minutes, whereby the intermediate film having an average film thickness shown in Table 1 was formed. Next, arc discharge was started to a target having a component ratio of the metal element(s) corresponding to the oxide film with an arc current of 130 A, mixed gas of O₂ and N₂ was supplied into the arc discharge ion plating apparatus to adjust the pressure therein to 0.5 to 1 Pa, and arc discharge was carried out by making a bias voltage of the substrate bias voltage of −40V where a pulse had been applied for 4 minutes. Then, O₂ gas alone is supplied to adjust the pressure to 0.5 to 1 Pa, and arc discharge was carried out to a target having a component ratio of the metal element(s) corresponding to the oxide film with an arc current of 130 A by making the bias voltage of the substrate bias voltage of −40V where a pulse had been applied for 15 to 35 minutes to form the oxide film having an average film thickness shown in Table 1. Next, N₂ gas was introduced into the arc discharge ion plating apparatus to adjust the pressure therein to 2 to 3 Pa, and arc discharge was carried out to a target having a component ratio of the metal element(s) corresponding to the upper film with an arc current of 180 A by making the bias voltage of the substrate bias voltage of −40V where a pulse had been applied for 30 to 40 minutes to form the upper film having an average film thickness shown in Table 1.

With regard to Comparative products 1 to 4, the substrate was mounted in an arc discharge ion plating apparatus in which targets having component ratios of the metal element(s) corresponding to an intermediate film, an oxide film and an upper film shown in Table 1 had been provided in the same manner as in Present products, and heated by a heater in vacuo of 0.5 Pa or less until the substrate temperature became 600° C. Then, an Ar etching was carried out to the substrate under the same conditions as in those of Present products, N₂ gas was introduced into the arc discharge ion plating apparatus to adjust the pressure therein to 2 Pa, and arc discharge was carried out to a target having a component ratio of the metal element(s) corresponding to the intermediate film under the conditions of a direct current bias voltage of the substrate of −100V and an arc current of 180 A for 260 to 280 minutes to coat the intermediate film having an average film thickness shown in Table 1. Next, arc discharge was started to a target having a component ratio of the metal element(s) corresponding to the oxide film with an arc current of 130 A, mixed gas of O₂ and N₂ was supplied into the arc discharge ion plating apparatus to adjust the pressure therein to 0.5 to 1 Pa, and arc discharge was carried out with an arc current of 130 A by making a bias voltage of the substrate a bias voltage of −70V where a pulse had been applied for 10 minutes. Then, O₂ gas alone was supplied to the arc discharge ion plating apparatus to adjust the pressure therein to 0.5 to 1 Pa, and arc discharge was carried out to a target having a component ratio of the metal element(s) corresponding to the oxide film with an arc current of 130 A by making a bias voltage of the substrate bias voltage of −70V where a pulse had been applied and for 30 to 35 minutes to coat the oxide film having an average film thickness shown in Table 1. Next, with regard to Comparative products 1 and 2, N₂ gas was introduced into the arc discharge ion plating apparatus to adjust the pressure therein to 2 to 3 Pa, and arc discharge was carried out to a target having a component ratio of the metal element(s) corresponding to the upper film under the conditions of a direct current bias voltage of the substrate of −40V and an arc current of 180 A for 30 to 60 minutes to form the upper film having an average film thickness shown in Table 1. With regard to Comparative products 3 and 4, mixed gas of C₂H₂ and N₂ gas was introduced into the arc discharge ion plating apparatus to adjust the pressure therein to 3 Pa, and arc discharge was carried out to a target having a component ratio of the metal element(s) corresponding to the upper film with a direct current bias voltage of the substrate of −90V and an arc current of 180 A for 50 minutes to form the upper film having an average film thickness shown in Table 1.

Cross-sectional structures of the obtained samples were observed by an optical microscope, a scanning electron microscope or a transmission electron microscope to measure average film thicknesses of the respective films. Also, cross-sectional structures of the samples were also measured with respect to the compositions of the respective films by using an energy dispersive X-ray spectrometer attached to the scanning electron microscope or an energy dispersive X-ray spectrometer attached to the transmission electron microscope. These results are shown in Table 1.

TABLE 1

| | Coating film | | | | | |
|---|---|---|---|---|---|---|
| | Intermediate film | | Oxide film | | Upper film | |
| Sample No. | Composition | Average film thickness (μm) | Composition | Average film thickness (μm) | Composition | Average film thickness (μm) | Average total film thickness (μm) |
|---|---|---|---|---|---|---|---|
| Present product 1 | $Ti_{0.35}Al_{0.65}N$ | 4.2 | $(Al_{0.9}Cr_{0.1})_2O_3$ | 0.6 | $Ti_{0.35}Al_{0.65}N$ | 0.3 | 5.1 |
| Present product 2 | $Ti_{0.5}Al_{0.4}Zr_{0.1}N$ | 4.7 | $(Al_{0.8}Cr_{0.2})_2O_3$ | 0.3 | $Ti_{0.5}Al_{0.4}Zr_{0.1}N$ | 0.4 | 5.4 |
| Present product 3 | $Ti_{0.55}Al_{0.45}N$ | 4.5 | $(Al_{0.7}Cr_{0.3})_2O_3$ | 0.6 | $Ti_{0.55}Al_{0.45}N$ | 0.3 | 5.4 |
| Present product 4 | Alternately laminated layer of TiN with thickness of 30 nm and $Ti_{0.55}Al_{0.45}N$ with thickness of 40 nm | 4.3 | $(Al_{0.5}Cr_{0.5})_2O_3$ | 0.5 | $Ti_{0.55}Al_{0.45}N$ | 0.5 | 5.3 |
| Comparative product 1 | $Ti_{0.35}Al_{0.65}N$ | 4.2 | $(Al_{0.7}Cr_{0.3})_2O_3$ | 0.6 | $Ti_{0.35}Al_{0.65}N$ | 0.3 | 5.1 |
| Comparative product 2 | $Ti_{0.55}Al_{0.45}N$ | 4.1 | $(Al_{0.5}Cr_{0.5})_2O_3$ | 0.6 | $Ti_{0.55}Al_{0.45}N$ | 0.6 | 5.3 |
| Comparative product 3 | $Al_{0.7}Cr_{0.3}N$ | 4.3 | $(Al_{0.7}Cr_{0.3})_2O_3$ | 0.5 | TiCN | 0.5 | 5.3 |
| Comparative product 4 | Alternately laminated layer of TiN with thickness of 30 nm and $Ti_{0.5}Al_{0.5}N$ with thickness of 40 nm | 4.6 | $(Al_{0.7}Cr_{0.3})_2O_3$ | 0.5 | TiCN | 0.5 | 5.6 |

With regard to the obtained samples, after removing the upper film and the oxide film by polishing, X-ray diffraction measurement by the 2θ/θ method was carried out by using an X-ray diffraction system RINT-TTRIII manufactured by RIGAKU CORPORATION. Measurement conditions were set to a tube voltage of 200 kV, a tube current of 15 mA, X-ray source of CuKα, X-ray incident slit of 5 mm, and a measurement range of 2θ to 10 to 140°. At this time, the intermediate films of all the samples were confirmed to be a cubic NaCl type structure. Further, an X-ray intensity distribution of an α axis in the pole figure for the (200) plane of the intermediate film was measured according to the measurement conditions and measurement method shown below.

[Measurement Conditions]
(1) TTR III level goniometer
(2) Multipurpose measurement attachment for pole
(3) Scanning method: concentric circle
(4) β scanning range: 0 to 360°/5° pitch
(5) β scanning speed: 180°/min
(6) γ amplitude: 0 mm

[Measurement Method (Schulz Reflection Method)]
(1) Fixed angle: a diffraction angle for the (200) plane of the intermediate film is made 43.1°.
(2) α scanning range: 20 to 90° (5° step)
(3) Target: Cu, Voltage: 50 kV, Current: 250 mA
(4) Divergence slit: ¼°
(5) Scatter slit: 6 mm
(6) Divergence vertical limit slit: 5 mm Among the diffraction lines of the intermediate films of the samples, a crystal plane showing the maximum peak height, and an α angle showing the maximum intensity in the X-ray intensity distributions of an α axis in the pole figure for the (200) plane of the intermediate films of the samples were measured, and these results are shown in Table 2.

TABLE 2

| | | | | Intermediate film | | |
|---|---|---|---|---|---|---|
| Sample No. | $K_{IC}$ of substrate (MPa·m$^{0.5}$) | dc (μm) | Crack coefficient R (m$^{0.5}$) | Crystal plane showing maximum peak height in X-ray diffraction | α angle (°) showing maximum intensity in X-ray intensity distribution of α axis in pole figure for (200) plane | Tool life (min) |
| Present product 1 | 11.1 | 176.6 | 0.10 | (200) plane | 85 | 24 |

TABLE 2-continued

| Sample No. | $K_{IC}$ of substrate (MPa·m$^{0.5}$) | dc (μm) | Crack coefficient R (m$^{0.5}$) | Intermediate film Crystal plane showing maximum peak height in X-ray diffraction | α angle (°) showing maximum intensity in X-ray intensity distribution of α axis in pole figure for (200) plane | Tool life (min) |
|---|---|---|---|---|---|---|
| Present product 2 | 11.1 | 210.2 | 0.08 | (200) plane | 90 | 25 |
| Present product 3 | 11.1 | 198.4 | 0.09 | (200) plane | 90 | 26 |
| Present product 4 | 11.1 | 159.1 | 0.11 | (200) plane | 85 | 22 |
| Comparative product 1 | 11.1 | 124.3 | 0.14 | (200) plane | 60 | 12 |
| Comparative product 2 | 11.1 | 134.8 | 0.13 | (200) plane | 65 | 18 |
| Comparative product 3 | 11.1 | 123.4 | 0.14 | (111) plane | — | 8 |
| Comparative product 4 | 11.1 | 113.9 | 0.16 | (200) plane | 70 | 17 |

Also, with regard to the crack lengths dc, by using a Vickers hardness meter manufactured by MATSUZAWA SEIKI CO., indentations formed by pushing it with the conditions of an applied load of 196N and a retention time of 15 seconds were photographed by a scanning electron microscope with 1000-fold to 3000-fold magnification, and the crack lengths dc were measured on the photograph. The dc is an average value of 3 portions. These results are shown in Table 2.

With regard to the obtained samples, after removing the coating film by diamond grindstones with 150 mesh, the samples were further polished with a depth of 21 μm from the surface of the substrate by diamond grindstones with 1500 mesh. Thereafter, mirror-polishing was further carried out by using a diamond paste having an average particle size of the diamond particles of 1 μm. A Vickers indenter was pushed into the mirror-polished surface with an applied load of 196N, and $K_{IC}$ of the substrate was measured by the Vickers indentation method. Next, a crack coefficient R was calculated from the $K_1$ of the substrate and the crack length dc. These results are shown in Table 2.

To evaluate the cutting properties of the prepared coated tools, cutting test was carried out under the following conditions.

[Cutting Test Conditions]
Work piece material: SUS304 (cylindrical),
Cutting speed: Vc=150 m/min,
Depth of cut: ap=2 mm,
Feed: f=0.3 mm/rev,
Cutting oil: using a water-soluble cutting liquid,
Judgment criteria of tool life: When flank wear width exceeded 0.3 mm, or a cutting edge was fractured, then, it is deemed as tool life.

As shown in Table 2, Present products wherein the crack coefficient Rs are 0.08 to 0.11 m$^{0.5}$ showed 1.2 to 3.3 times longer tool life than Comparative products wherein the crack coefficient Rs are 0.13 to 0.16 m$^{0.5}$. Among the diffraction lines of the intermediate films of Present products, X-ray diffraction peak height of the (200) plane diffraction line was the highest. Also, α angles showing the maximum intensity of an X-ray intensity distribution of an α axis of the pole figure with regard to the (200) plane of the intermediate film of Present products were in the range of 85 to 90°. In the intermediate film of Comparative product 3, an X-ray diffraction peak height of the (111) plane diffraction line was the highest.

In the intermediate films of Comparative products 1, 2 and 4, the X-ray diffraction peak heights of the (200) plane diffraction lines were the highest, but α angles showing the maximum intensity of an X-ray intensity distribution of an α axis of the pole figure with regard to the (200) plane of the intermediate films of Comparative products 1, 2 and 4 were 70° or lower.

Example 2

As the substrate, a cutting insert which is a cemented carbide consisting of 91.6% by volume of WC, and 8.4% by volume of a Co alloy (Co alloy consisting of 94% by mass Co-6% by mass Cr) and has an average grain size of WC obtained by the Fullman's equation of 0.8 μm, and which has a shape of an ISO Standard CNMG120408 was prepared.

With regard to Present products 5 to 7, the substrate was mounted in an arc discharge ion plating apparatus in which targets having component ratios of the metal element(s) corresponding to an intermediate film, an oxide film and an upper film shown in Table 3 had been provided, and heated by a heater in vacuo of 0.5 Pa or less until the substrate temperature became 600° C. Then, Ar gas was introduced into the arc discharge ion plating apparatus, a pressure in the arc discharge ion plating apparatus was adjusted to 0.8 Pa to make an Ar atmosphere. Ar etching was carried out to the substrate with a direct current bias voltage of −250V for 60 minutes, then, $N_2$ gas was introduced into the arc discharge ion plating apparatus to adjust the pressure therein to 2 to 3 Pa. Further, arc discharge was carried out to a target having a component ratio of the metal element(s) corresponding to the intermediate film under the conditions of a direct current bias voltage of the substrate of −60V and an arc current of 200 A for 200 to 210 minutes, whereby the intermediate film having an average film thickness shown in Table 3 was formed. Next, arc discharge was started to a target having a component ratio of the metal element(s) corresponding to the oxide film with an arc current of 160 A, mixed gas of $O_2$ and $N_2$ was supplied into the arc discharge ion plating apparatus to adjust the pressure therein to 0.5 to 1 Pa, and arc discharge was carried out with an arc current of 160 A by making a bias voltage of the substrate bias voltage of −40V where a pulse had been applied for 2 minutes. Then, $O_2$ gas alone was supplied to adjust the pressure therein to 0.5 to 1 Pa, and arc discharge was carried out to a target having a component ratio of the metal element(s) corresponding to the oxide film with an arc current of 160 A by making a bias voltage of the substrate bias voltage of −40V where a pulse had been applied for 15 to 35 minutes to form the oxide film having an average film thickness shown in Table 3. Next, $N_2$ gas was introduced into the arc discharge ion plating apparatus to adjust the pressure therein to 2 to 3 Pa, and arc discharge was carried out to a target having a component ratio of the metal element(s) corresponding to the upper film with an arc current of 200 A by making a bias voltage of the substrate bias voltage of −40V where a pulse had been applied for 30 to 40 minutes to form the upper film having an average film thickness shown in Table 3.

With regard to Comparative product 5, the substrate was mounted in an arc discharge ion plating apparatus in which targets having component ratios of the metal element(s) corresponding to an intermediate film, an oxide film and an upper film shown in Table 3 had been provided in the same manner as in Present products, and heated by a heater in vacuo of 0.5 Pa or less until the substrate temperature became 600° C. Then, an Ar etching was carried out to the substrate under the same conditions as in those of Present products, $N_2$ gas was introduced into the arc discharge ion plating apparatus to adjust the pressure therein to 2 Pa, and arc discharge was carried out to a target having a component ratio of the metal element(s) corresponding to the intermediate film under the conditions of a direct current bias voltage of the substrate of −30V and an arc current of 180 A for 210 minutes to coat the intermediate film having an average film thickness shown in Table 3. Next, arc discharge was started to a target having a component ratio of the metal element(s) corresponding to the oxide film with an arc current of 190 A, mixed gas of $O_2$ and $N_2$ was supplied into the arc discharge ion plating apparatus to adjust the pressure therein to 0.5 to 1 Pa, and arc discharge was carried out with an arc current of 190 A by making a bias voltage of the substrate a bias voltage of −70V where a pulse had been applied for 10 minutes. Then, $O_2$ gas alone was supplied to adjust the pressure to 0.5 to 1 Pa, and arc discharge was carried out to a target having a component ratio of the metal element(s) corresponding to the oxide film with an arc current of 190 A by making a bias voltage of the substrate bias voltage of −70V where a pulse had been applied for 15 minutes to coat the oxide film having an average film thickness shown in Table 3. Next, $N_2$ gas was introduced into the arc discharge ion plating apparatus to adjust the pressure therein to 2 to 3 Pa, and arc discharge was carried out to a target having a component ratio of the metal element(s) corresponding to the upper film under the conditions of a direct current bias voltage of the substrate of −40V and an arc current of 180 A for 20 minutes to form the upper film having an average film thickness shown in Table 3.

With regard to Comparative products 6 and 7, the substrate was mounted in an arc discharge ion plating apparatus in which targets having component ratios of the metal element(s) corresponding to an intermediate film, an oxide film and an upper film shown in Table 3 had been provided in the same manner as in Present products, and heated by a heater in vacuo of 0.5 Pa or less until the substrate temperature became 600° C. Then, an Ar etching was carried out to the substrate under the same conditions as in those of Present products, $N_2$ gas was introduced into the arc discharge ion plating apparatus to adjust the pressure therein to 2 Pa, and arc discharge was carried out to a target having a component ratio of the metal element(s) corresponding to the intermediate film under the conditions of a direct current bias voltage of the substrate of −100V and an arc current of 200 A for 200 to 210 minutes to coat the intermediate film having an average film thickness shown in Table 3. Next, arc discharge was started to a target having a component ratio of the metal element(s) corresponding to the oxide film with an arc current of 190 A, mixed gas of $O_2$ and $N_2$ was supplied into the arc discharge ion plating apparatus to adjust the pressure therein to 0.5 to 1 Pa, and arc discharge was carried out with an arc current of 190 A by making a bias voltage of the substrate a bias voltage of −70V where a pulse had been applied for 10 minutes. Then, $O_2$ gas alone was supplied to adjust the pressure to 0.5 to 1 Pa, and arc discharge was carried out to a target having a component ratio of the metal element(s) corresponding to the oxide film with an arc current of 190 A by making a bias voltage of the substrate bias voltage of −70V where a pulse had been applied for 30 to 35 minutes to form the oxide film having an average film thickness shown in Table 3. Next, mixed gas of $C_2H_2$ and $N_2$ was introduced into the arc discharge ion plating apparatus to adjust the pressure therein to 3 Pa, and arc discharge was carried out to a target having a component ratio of the metal element(s) corresponding to the upper film with a direct current bias voltage of the substrate of −90V and an arc current of 180 A for 50 minutes to form the upper film having an average film thickness shown in Table 3.

The cross-sectional structures of the obtained samples were observed by an optical microscope, scanning electron microscope or transmission electron microscope to measure an average film thickness of each film. Also, the cross-sectional structures of the samples were measured with respect to a composition of each film by using an energy dispersive X-ray spectrometer attached to a scanning electron microscope or an energy dispersive X-ray spectrometer attached to a transmission electron microscope. These results were shown in Table 3.

TABLE 3

| | Coating film | | | | | | |
|---|---|---|---|---|---|---|---|
| | Intermediate film | | Oxide film | | Upper film | | |
| Sample No. | Composition | Average film thickness (μm) | Composition | Average film thickness (μm) | Composition | Average film thickness (μm) | Average total film thickness (μm) |
| Present product 5 | $Ti_{0.5}Al_{0.4}Cr_{0.1}N$ | 3.3 | $(Al_{0.8}Cr_{0.2})_2O_3$ | 0.2 | $Ti_{0.5}Al_{0.4}Cr_{0.1}N$ | 0.4 | 3.9 |
| Present product 6 | $Ti_{0.55}A_{0.45}N$ | 3.3 | $(Al_{0.7}Cr_{0.3})_2O_3$ | 0.3 | $Ti_{0.55}Al_{0.45}N$ | 0.6 | 4.2 |

TABLE 3-continued

| | Coating film | | | | | | |
|---|---|---|---|---|---|---|---|
| | Intermediate film | | Oxide film | | Upper film | | |
| Sample No. | Composition | Average film thickness (μm) | Composition | Average film thickness (μm) | Composition | Average film thickness (μm) | Average total film thickness (μm) |
| Present product 7 | Alternate laminate of $Ti_{0.5}Al_{0.5}N$ with thickness of 40 nm and $Ti_{0.33}Al_{0.67}N$ with thickness of 40 nm | 3.1 | $(Al_{0.6}Cr_{0.4})_2O_3$ | 0.5 | $Ti_{0.5}Al_{0.5}N$ | 0.5 | 4.1 |
| Comparative product 5 | $Ti_{0.55}Al_{0.45}N$ | 3.0 | $(Al_{0.5}Cr_{0.5})_2O_3$ | 0.2 | $Ti_{0.55}Al_{0.45}N$ | 0.3 | 3.5 |
| Comparative product 6 | $Al_{0.7}Cr_{0.3}N$ | 3.3 | $(Al_{0.7}Cr_{0.3})_2O_3$ | 0.5 | TiCN | 0.5 | 4.3 |
| Comparative product 7 | Alternate laminate of TiN with thickness of 30 nm and $Ti_{0.5}Al_{0.5}N$ with thickness of 30 nm | 3.4 | $(Al_{0.7}Cr_{0.3})_2O_3$ | 0.5 | TiCN | 0.5 | 4.4 |

With regard to the obtained samples, after removing the upper film and the oxide film by polishing, X-ray diffraction measurement by the 2θ/θ method was carried out under the same conditions as those in Example 1. At this time, the intermediate films of all the samples were confirmed to be a cubic NaCl type structure. Further, an X-ray intensity distribution of an α axis in the pole figure for the (200) plane of the intermediate films of all the samples were measured in the same manner as in Example 1 except for changing a fixed angle: the diffraction angle of the (200) plane of the intermediate film to 43.2°.

Among the diffraction lines of the intermediate film of the samples, a crystal plane showing the maximum peak height, and an α angle showing the maximum intensity in the X-ray intensity distributions of an α axis in the pole figure for the (200) plane of the intermediate film of the samples were measured, and these results are shown in Table 4.

Also, in the same manner as in Example 1, the crack length dc was measured. These results are shown in Table 4.

With regard to the obtained samples, $K_{IC}$ of the substrate was measured in the same manner as in Example 1. Next, crack coefficient R was calculated from $K_{IC}$ of the substrate and the crack length dc. These results are shown in Table 4.

To evaluate the cutting properties of the prepared coated tools, cutting tests were carried out under the following conditions.

[Cutting Test Conditions]
Work piece material: SUS304 (cylindrical),
Cutting speed: Vc=200 m/min,
Depth of cut: ap=1 mm,
Feed: f=0.2 mm/rev,
Cutting oil: using a water-soluble cutting liquid,
Judgment criteria of tool life: When the flank wear width exceeded 0.3 mm, or a cutting edge was fractured, then, it is deemed as tool life.

TABLE 4

| | | | | Intermediate film | | |
|---|---|---|---|---|---|---|
| Sample No. | $K_{IC}$ of substrate (MPa·m$^{0.5}$) | dc (μm) | Crack coefficient R (m$^{0.5}$) | Crystal plane showing maximum peak height in X-ray diffraction | α angle (°) showing maximum intensity in X-ray intensity distribution of α axis in pole figure for (200) plane | Tool life (min) |
| Present product 5 | 8.4 | 309.0 | 0.08 | (200) plane | 90 | 28 |
| Present product 6 | 8.4 | 303.0 | 0.08 | (200) plane | 90 | 29 |
| Present product 7 | 8.4 | 274.5 | 0.09 | (200) plane | 85 | 24 |
| Comparative product 5 | 8.4 | 373.1 | 0.06 | (200) plane | 70 | 12 |
| Comparative product 6 | 8.4 | 179.5 | 0.13 | (111) plane | — | 19 |
| Comparative product 7 | 8.4 | 176.8 | 0.13 | (200) plane | 60 | 20 |

As shown in Table 4, Present products wherein the crack coefficient Rs are 0.08 to 0.09 $m^{0.5}$ shows 1.2 to 2.4-fold tool life of Comparative products wherein the crack coefficient Rs are 0.06 $m^{0.5}$ or 0.13 $m^{0.5}$. Incidentally, among the diffraction lines of the intermediate films of Present products, the X-ray diffraction peak height of the (200) plane diffraction line was the highest. Also, α angles showing the maximum intensity in an X-ray intensity distribution of an α axis of the pole figure with regard to the (200) plane of the intermediate film of Present products were in the range of 85 to 90°. In the intermediate film of Comparative product 6, an X-ray diffraction peak height of the (111) plane diffraction line was the highest. The intermediate films of Comparative products 5 and 7 showed that X-ray diffraction peak heights of the (200) plane diffraction lines were the highest, but α angles showing the maximum intensity in an X-ray intensity distribution of an α axis of the pole figure with regard to the (200) plane of the intermediate films of Comparative products 5 and 7 were 70° or lower.

Example 3

As the substrate, a cutting insert which is a cemented carbide consisting of 78.6% by volume of WC, 2.5% by volume of (Nb,W)C and 18.9% by volume of a Co alloy (Co alloy consisting of 94% by mass Co-6% by mass Cr) and has an average grain size of WC obtained by the Fullman's equation of 1.5 μm, and which has a shape of an ISO Standard CNMG120408 was prepared.

With regard to Present products 8 and 9, the substrate was mounted in an arc discharge ion plating apparatus in which targets having component ratios of the metal element(s) corresponding to an intermediate film, an oxide film and an upper film shown in Table 5 had been provided, and heated by a heater in vacuo of 0.5 Pa or less until the substrate temperature became 600° C. Then, Ar gas was introduced into the arc discharge ion plating apparatus, a pressure in the arc discharge ion plating apparatus was adjusted to 0.8 Pa to make an Ar atmosphere. Ar etching was carried out to the substrate with a direct current bias voltage of −250V for 60 minutes, then, $N_2$ gas was introduced into the arc discharge ion plating apparatus to adjust the pressure therein to 2 to 3 Pa. Further, arc discharge was carried out to a target having a component ratio of the metal element(s) corresponding to the intermediate film under the conditions of a direct current bias voltage of the substrate of −50V and an arc current of 150 A for 140 to 180 minutes, whereby the intermediate film having an average film thickness shown in Table 5 was formed. Next, arc discharge was started to a target having a component ratio of the metal element(s) corresponding to the oxide film with an arc current of 160 A, mixed gas of $O_2$ and $N_2$ was supplied into the arc discharge ion plating apparatus to adjust the pressure therein to 0.5 to 1 Pa, and arc discharge was carried out with an arc current of 160 A by making a bias voltage of the substrate bias voltage of −40V where a pulse had been applied for 5 minutes. Then, $O_2$ gas alone was supplied to adjust the pressure to 0.5 to 1 Pa, and arc discharge was carried out to a target having a component ratio of the metal element(s) corresponding to the oxide film with an arc current of 160 A by making a bias voltage of the substrate bias voltage of −40V where a pulse had been applied for 15 to 35 minutes to form the oxide film having an average film thickness shown in Table 5. Next, $N_2$ gas was introduced into the arc discharge ion plating apparatus to adjust the pressure therein to 2 to 3 Pa, and arc discharge was carried out to a target having a component ratio of the metal element(s) corresponding to the upper film with an arc current of 150 A by making a bias voltage of the substrate bias voltage of −40V where a pulse had been applied for 30 to 60 minutes to form the upper film having an average film thickness shown in Table 5.

With regard to Comparative products 8 and 9, the substrate was mounted in an arc discharge ion plating apparatus in which targets having component ratios of the metal element(s) corresponding to an intermediate film, an oxide film and an upper film shown in Table 5 had been provided in the same manner as in Present products, and heated by a heater in vacuo of 0.5 Pa or less until the substrate temperature became 600° C. Then, an Ar etching was carried out to the substrate under the same conditions as in those of Present products, $N_2$ gas was introduced into the arc discharge ion plating apparatus to adjust the pressure therein to 2 Pa, and arc discharge was carried out to a target having a component ratio of the metal element(s) corresponding to the intermediate film under the conditions of a direct current bias voltage of the substrate of −100V and an arc current of 150 A for 140 minutes to coat the intermediate film having an average film thickness shown in Table 5. Next, arc discharge was started to a target having a component ratio of the metal element(s) corresponding to the oxide film with an arc current of 160 A, mixed gas of $O_2$ and $N_2$ was supplied into the arc discharge ion plating apparatus to adjust the pressure therein to 0.5 to 1 Pa, and arc discharge was carried out by making a bias voltage of the substrate a bias voltage of −70V where a pulse had been applied for 10 minutes. Then, $O_2$ gas alone was supplied to adjust the pressure to 0.5 to 1 Pa, and arc discharge was carried out to a target having a component ratio of the metal element(s) corresponding to the oxide film with an arc current of 160 A by making a bias voltage of the substrate bias voltage of −70V where a pulse had been applied for 30 to 35 minutes to form the oxide film having an average film thickness shown in Table 5. Next, $N_2$ gas was introduced into the arc discharge ion plating apparatus to adjust the pressure therein to 2 to 3 Pa, and arc discharge was carried out to a target having a component ratio of the metal element(s) corresponding to the upper film under the conditions of a direct current bias voltage of the substrate of −40V and an arc current of 150 A for 30 to 60 minutes to form the upper film having an average film thickness shown in Table 5.

The cross-sectional structures of the obtained samples were observed by using an optical microscope, a scanning electron microscope or a transmission electron microscope to measure an average film thickness of each film. Also, the cross-sectional structures of the samples were measured with respect to a composition of each film by using an energy dispersive X-ray spectrometer attached to the scanning electron microscope or an energy dispersive X-ray spectrometer attached to the transmission electron microscope. These results are shown in Table 5.

TABLE 5

| Sample No. | Coating film | | | | | | |
|---|---|---|---|---|---|---|---|
| | Intermediate film | | Oxide film | | Upper film | | |
| | Composition | Average film thickness (μm) | Composition | Average film thickness (μm) | Composition | Average film thickness (μm) | Average total film thickness (μm) |
| Present product 8 | $Ti_{0.35}Al_{0.65}N$ | 2.0 | $(Al_{0.7}Cr_{0.3})_2O_3$ | 0.6 | $Ti_{0.35}Al_{0.65}N$ | 0.3 | 2.9 |
| Present product 9 | $Ti_{0.55}Al_{0.45}N$ | 1.5 | $(Al_{0.8}Cr_{0.2})_2O_3$ | 0.4 | $Ti_{0.55}Al_{0.45}N$ | 0.6 | 2.5 |
| Comparative product 8 | $Ti_{0.35}Al_{0.65}N$ | 1.9 | $(Al_{0.7}Cr_{0.3})_2O_3$ | 0.6 | $Ti_{0.35}Al_{0.65}N$ | 0.3 | 2.8 |
| Comparative product 9 | $Ti_{0.55}Al_{0.45}N$ | 1.9 | $(Al_{0.4}Cr_{0.6})_2O_3$ | 0.6 | $Ti_{0.55}Al_{0.45}N$ | 0.6 | 3.1 |

With regard to the obtained samples, after removing the upper film and the oxide film by polishing, X-ray diffraction measurement by the 2θ/θ method was carried out under the same measurement conditions as in Example 1. At this time, the intermediate films of all the samples were confirmed to be cubic NaCl type structure and the peak of the (200) plane diffraction line was the highest among the intermediate films. Further, an X-ray intensity distribution of an α axis of the pole figure with regard to the (200) plane of the intermediate film was measured in the same manner as in Example 1.

Among the diffraction lines of the intermediate film of the samples, a crystal plane showing the maximum peak height, and an α angle showing the maximum intensity in the X-ray intensity distribution of an α axis in the pole figure for the (200) plane of the intermediate film of the sample were measured, and these results are shown in Table 6.

TABLE 6

| Sample No. | $K_{IC}$ of a substrate ($MPa \cdot m^{0.5}$) | dc (μm) | Crack coefficient R ($m^{0.5}$) | Intermediate film | | Tool life (min) |
|---|---|---|---|---|---|---|
| | | | | Crystal plane showing maximum peak height in X-ray diffraction | α angle (°) showing maximum intensity in X-ray intensity distribution of α axis of pole figure for (200) plane | |
| Present product 8 | 17.5 | 93.4 | 0.12 | (200) plane | 90 | 11 |
| Present product 9 | 17.5 | 104.3 | 0.11 | (200) plane | 90 | 12 |
| Comparative product 8 | 17.5 | 80.5 | 0.14 | (200) plane | 70 | 8 |
| Comparative product 9 | 17.5 | 84.8 | 0.13 | (200) plane | 60 | 6 |

Also, in the same manner as in Example 1, the crack length dc was measured. These results are shown in Table 6.

With regard to the obtained samples, $K_1$ of the substrate was measured in the same manner as in Example 1 except for polishing the surface of the substrate to the depth of 23 μm by diamond grindstones. Next, the crack coefficient R was calculated from $K_{IC}$ and crack length dc of the substrate. These results are shown in Table 6.

To evaluate cutting properties of the prepared coated tools, cutting test was carried out under the same conditions as in Example 1.

As shown in Table 6, Present products in which the crack coefficient R is 0.11 to 0.12 $m^{0.5}$, shows 1.4 to 2-fold tool life as compared with those of Comparative products in which the crack coefficient R is 0.13 to 0.14 $m^{0.5}$. Incidentally, an X-ray diffraction peak height of the (200) plane diffraction line was the highest among the diffraction lines of the intermediate films of Present products. Also, an α angle showing the maximum intensity in the X-ray intensity distribution of an α axis in the pole figure with regard to the (200) plane of the intermediate films of Present products was 90°. On the other hand, in the intermediate films of Comparative products 8 and 9, the X-ray diffraction peak heights of the (200) plane diffraction line were the highest, but the α angles of the intermediate films of Comparative products 8 and 9 were 70° or less.

EXPLANATION OF REFERENCE NUMERALS

1 Vickers indentation
2 Crack
3 Vickers indentation
4 Crack
5 Divergence slit (DS)
6 Center of the sample
7 Divergence vertical limit slit (Schulz slit)
8 Receiving slit (RS)
9 Scatter slit (SS)
10 Counter

What is claimed is:

1. A coated tool which comprises a substrate and a coating film coated on a surface thereof, wherein the coating film comprises an intermediate film coated on the surface of the substrate, and an oxide film coated on a surface of the intermediate film by a physical vapor deposition, and wherein a crack coefficient R obtained by measuring a crack length dc (μm) which is generated on the surface of the coated tool by pushing a Vickers indenter into the surface of the coated tool with an applied load P of 196N, and a fracture toughness $K_{IC}$ (MPa·m$^{0.5}$) of the substrate, and by calculating from the following Numerical formula 1:

$$R = P/(dc \cdot K_{IC}),$$

is 0.07 to 0.12m$^{0.5}$.

2. The coated tool according to claim 1, wherein the coating film comprises the intermediate film comprising a metal compound represented by ML
   wherein M represents at least one element selected from Ti, Zr, Hf, V, Nb, Ta, Cr, Mo, W, Al and Si, and L represents one or two elements selected from C and N,
having an average film thickness of 1 to 6 μm, which film comprises a single layer film or a multi-layered film of two or more layers,
the oxide film comprising $(Al_{(1-y)}Cr_y)_2O_3$
   wherein y represents an atomic ratio of Cr based on the sum of Al and Cr, and y satisfies 0.1≤y≤0.5,
having an average film thickness of 0.01 to 0.9 μm, coated on the surface of the intermediate film, and
an upper film comprising a metal compound represented by QJ
   wherein Q represents at least one element selected from Ti, Zr, Hf, V, Nb, Ta, Cr, Mo, W, Al and Si, and J represents at least one element selected from C, N and O,
having an average film thickness of 0.2 to 2 μm, which film comprises a single layer film or a multi-layered film of two or more layers and is coated on the surface of the oxide film.

3. The coated tool according to claim 2, wherein the coating film comprises the intermediate film comprising $Ti_{(1-x)}Al_xN$
   wherein x represents an atomic ratio of Al based on the sum of Ti and Al, and x satisfies 0.35≤x≤0.7,
having an average film thickness of 1 to 6 μm,
the oxide film comprising $(Al_{(1-y)}Cr_y)_2O_3$
   wherein y represents an atomic ratio of Cr based on the sum of Al and Cr, and y satisfies 0.1≤y≤0.5,
having an average film thickness of 0.01 to 0.9 μm, coated on the surface of the intermediate film, and
the upper film comprising $Ti_{(1-z)}Al_zN$
   wherein z represents an atomic ratio of Al based on the sum of Ti and Al, and z satisfies 0≤z≤0.7,
having an average film thickness of 0.2 to 2 μm, coated on the surface of the oxide film.

4. The coated tool according to claim 1, wherein the crack coefficient R obtained by the Numerical formula 1 is 0.08 to 0.11 m$^{0.5}$.

5. The coated tool according to claim 1, wherein the intermediate film comprises at least one selected from the group consisting of TiN, TiCN, TiAlN, TiAlZrN, TiAlCrN and AlCrN.

6. The coated tool according to claim 3, wherein x of the intermediate film satisfies 0.4≤x≤0.6.

7. The coated tool according to claim 1, wherein an average film thickness of the intermediate film is 3 to 6 μm.

8. The coated tool according to claim 1, wherein the intermediate film is cubic.

9. The coated tool according to claim 8, wherein a peak intensity of a (200) plane diffraction line of the intermediate film is the highest among diffraction lines of the intermediate film in an X-ray diffraction measurement using Cu-Kα ray.

10. The coated tool according to claim 8, wherein an X-ray intensity distribution of an α axis of the pole figure with regard to the (200) plane of the intermediate film shows the maximum intensity in the range of an α angle of 80 to 90°.

11. The coated tool according to claim 2, wherein y of the oxide film satisfies 0.1≤y≤0.3.

12. The coated tool according to claim 1, wherein the oxide film comprises at least one selected from the group consisting of $(Al_{0.5}Cr_{0.5})_2O_3$, $(Al_{0.55}Cr_{0.45})_2O_3$, $(Al_{0.6}Cr_{0.4})_2O_3$, $(Al_{0.7}Cr_{0.3})_2O_3$, $(Al_{0.8}Cr_{0.2})_2O_3$ and $(Al_{0.9}Cr_{0.1})_2O_3$.

13. The coated tool according to claim 1, wherein an average film thickness of the oxide film is 0.1 to 0.5 μm.

14. The coated tool according to claim 3, wherein z of the upper film satisfies 0.45≤z≤0.7.

15. The coated tool according to claim 2, wherein the upper film comprises at least one selected from the group consisting of TiN, TiCN, TiAlN, TiAlZrN, TiAlCrN and AlCrN.

16. The coated tool according to claim 2, wherein an average film thickness of the upper film is 0.4 to 2 μm.

17. The coated tool according to claim 1, wherein the substrate is a cemented carbide comprising 75 to 93% by volume of WC, 0 to 5% by volume of a cubic crystal phase comprising at least one selected from a carbide or a nitride of Ti, Zr, Hf, V, Nb, Ta, Cr, Mo and W and mutual solid solutions thereof, and 7 to 20% by volume of a binder phase comprising Co as a main component, and an average grain size of WC is 0.5 to 2 μm.

18. The coated tool according to claim 1, wherein the substrate is a cemented carbide of WC having an average grain size of 0.5 to 2 μm obtained by the following Fullman's equation of the Numerical formula 2:

$$dm = (4/\pi) \times (NL/NS)$$

wherein dm represents the average grain size of WC, π is a circular constant, NL represents a number of WC per a unit length hit by an arbitrary straight line on the cross-sectional structure of a photograph which is taken with regard to the cross-sectional structure of the sintered body, and NS represents a number of WC contained in an arbitrary unit area.

19. The coated tool according to claim 17, wherein the cubic crystal phase is at least one selected from the group consisting of (Nb,W)C, (Nb,W)CN, (Ti,W)C, (Ti,W)CN, (Ti,Ta,W)C, (Ti,Ta,W)CN, (Ti,Nb,W)C, (Ti,Nb,W)CN, (Ti,Ta,Nb,W)C, (Ti,Ta,Nb,W)CN, (Ti,Ta,Zr,W)C, (Ti,Ta,Zr,W)CN, (Ti,Nb,Zr,W)C, (Ti,Nb,Zr,W)CN, (Ti,Ta,Nb,Zr,W)C and (Ti,Ta,Nb,Zr,W)CN.

20. The coated tool according to claim 17, wherein the binder phase comprising Co as a main component is a binder phase consisting of Co or a binder phase comprising Co alloy in which at least one of Ti, Zr, Hf, V, Nb, Ta, Cr, Mo and W is dissolved in Co in an amount of 30% by mass or less based on the whole Co alloy.

* * * * *